(12) United States Patent
Lin et al.

(10) Patent No.: US 9,208,858 B1
(45) Date of Patent: Dec. 8, 2015

(54) STATIC RANDOM ACCESS MEMORY WITH ASSIST CIRCUIT

(71) Applicant: Taiwan Semiconductor Manufacturing Company, Ltd., Hsin-Chu (TW)

(72) Inventors: Kao-Cheng Lin, Taipei (TW); Hidehiro Fujiwara, Hsin-Chu (TW); Wei Min Chan, Sindian (TW); Yen-Huei Chen, Jhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/331,799

(22) Filed: Jul. 15, 2014

(51) Int. Cl.
*G11C 8/00* (2006.01)
*G11C 11/419* (2006.01)

(52) U.S. Cl.
CPC .................... *G11C 11/419* (2013.01)

(58) Field of Classification Search
CPC ......... G11C 8/16; G11C 7/075; G11C 11/412
USPC .................... 365/230.05, 154, 189.16, 189.14
See application file for complete search history.

(56) References Cited

U.S. PATENT DOCUMENTS 6,346,825 B1 * 2/2002 Pang et al. ........................ 326/40
7,248,491 B1 * 7/2007 Ching et al. ................ 365/49.15
8,625,334 B2 * 1/2014 Liaw ............................ 365/154

* cited by examiner

*Primary Examiner* — Son Dinh
(74) *Attorney, Agent, or Firm* — Slater & Matsil, L.L.P.

(57) ABSTRACT

A static random access memory (SRAM) includes a first port word line, a second port word line, a first port bit line and a first port complementary bit line, a second port bit line and second port complementary bit line, and a memory cell having a data node coupled to the first and second port bit lines and a complementary data node coupled to the first and second port complementary bit lines. The first and second port word lines control access to the dual port memory cell. A circuit couples the second port bit line to a high voltage supply node during a write logic high operation to the data node through the first port bit line and couple the second port complementary bit line to the high voltage supply node during a write logic high operation to the complementary data node through the first port complementary bit line.

20 Claims, 6 Drawing Sheets

STATIC RANDOM ACCESS MEMORY WITH ASSIST CIRCUIT

CROSS-REFERENCE TO RELATED APPLICATIONS

The present application is related to U.S. patent application Ser. No. 14/043,869 filed on Oct. 2, 2013, which is incorporated herein by reference.

BACKGROUND

Static random access memories (SRAM) are commonly used in integrated circuits. Embedded SRAM is popular in high speed communication, image processing and system-on-chip (SOC) applications. SRAM cells have the advantageous feature of holding data without requiring a refresh. Typically, a SRAM cell includes two pass-gate transistors, through which a bit can be read from or written into the SRAM cell. This type of SRAM cell is referred to as a single port SRAM cell. Another type of SRAM cell is referred to as a dual port SRAM cell, which includes four pass-gate transistors. With two ports, the bit stored in the SRAM cell can be read from port-A and port-B simultaneously. This allows for parallel operations by different applications. Moreover, if a first SRAM cell and a second SRAM cell are in a same column or a same row, a read operation from the first SRAM cell can also be performed simultaneously with a write operation to the second SRAM cell.

As timing and voltage margins have reduced, operational errors can occur. One type of error is called "read-disturb-write". Assume for example a first SRAM cell in a row is being written to on Port A. If the Port B word line is active, for example so that a read or write operation can occur to the Port B of a second cell, then the Port B of the first cell is under a "dummy read" condition. This dummy read condition may induce error in the write operation to the Port A of the first SRAM cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
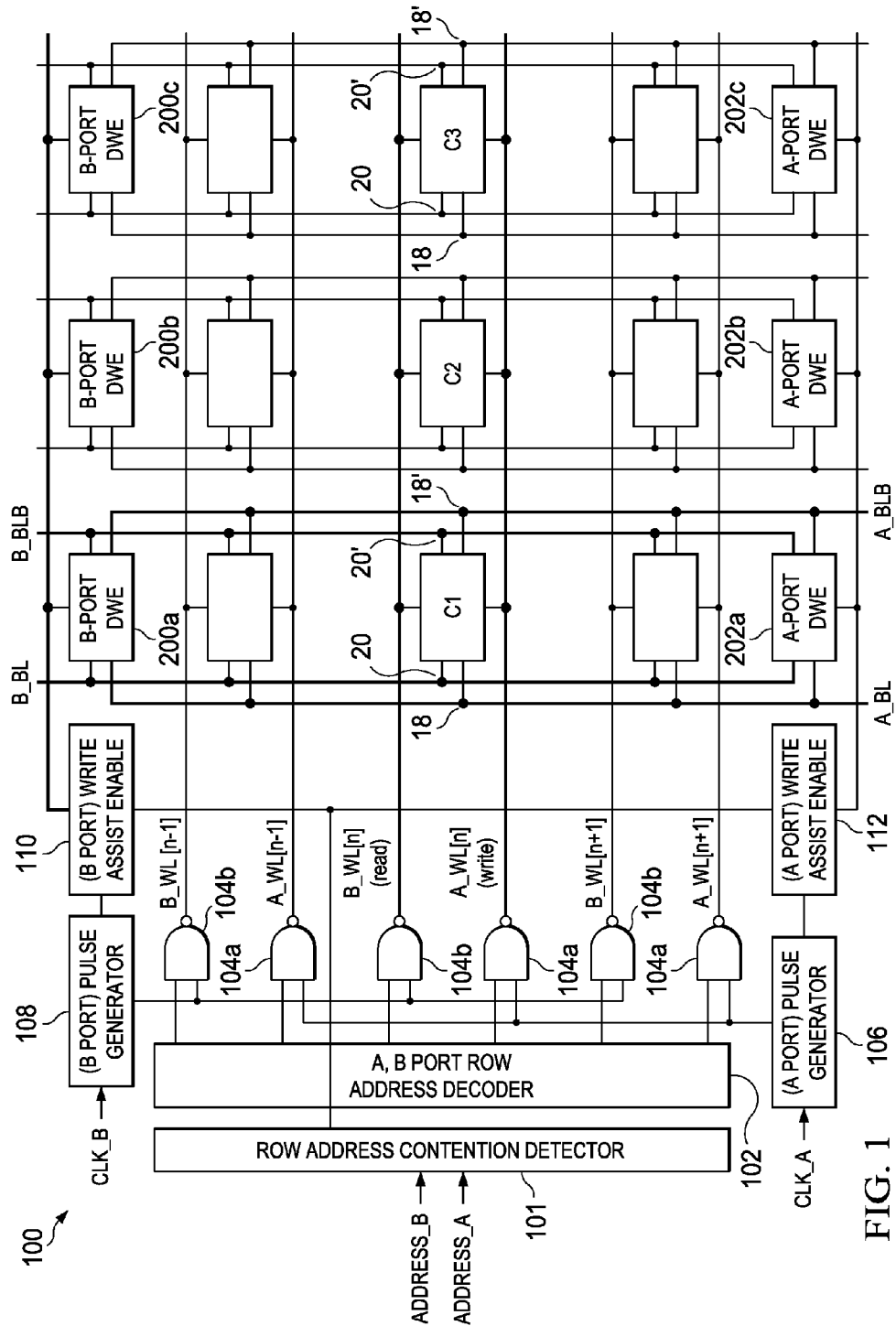
FIG. 1 illustrates a SRAM macro having A-port and B-port double write enhancement (DWE) circuits for providing write assist according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a SRAM macro 100 ("SRAM") having A-port and B-port double write enhancement (DWE) circuits 200 and 202 for providing write assist according to some embodiments. The SRAM 100 includes some illustrated components familiar to those in the art, which will be listed but not discussed in detail so as to avoid obscuring the present disclosure. The SRAM 100 includes a row decoder 102 coupled to the A and B word lines (three of which are illustrated) through respective NAND gates 104a and 104b. The NAND gates 104a are connected to the A-port word lines and also each have an input coupled to the A-port pulse generator 106. Likewise, the NAND gates 104b are connected to the B-port word lines and also have an input connected to the B-port pulse generator 108. The output of the NAND gates 104 are the A_WL and B_WL enable signals.

A row address contention detector 101 is arranged to receive address A for A-port and address B for B-port for memory cell access and to detect if the row addresses of both ports are matched or not. The output flag is TRUE when addresses are matched. A-port write assist enable circuit 112 and B-port write assist enable circuit 110 control the B-port DWE 200 and A-port DWE 202, respectively. If row addresses of both ports are matched (the row address contention detector 101 sends output flag "TRUE") and the write operation on A-port or B-port is performed, the write assist enable circuit 112 or 110 of the corresponding port sends out enable signal to the corresponding DWE 202 or 200 so that the write assist function is enabled.

With particular attention to one row, the middle row of SRAM cells includes SRAM cell C1, C2, and C3. Each SRAM cell is a dual port cell and thus includes an A port 18 (and its logical inverse (complement) labeled 18') and a B port 20 (and its logical inverse labeled 20'). The A ports 18, 18' are coupled to the A-port bit lines labeled A_BL and A_BLB, respectively. Similarly, the B ports 20, 20' are coupled to the B-port bit lines labeled B_BL and B_BLB, respectively. Each SRAM cell is also connected to a respective A-port word line (labeled A_WL) and B-port word line (labeled B_WL). The A_WL and B_WL control access to the SRAM cell for a read or write operation.

The B-port and A-port pulse generators 108, 106 are also coupled to the B-port and A-port write assist enable circuit 110, 112 respectively. The outputs of the B-port write assist enable circuit 110 and A-port write assist enable circuit 112 are provided to the B-port DWEs and A-port DWEs 200 and 202 respectively. The operation of the DWEs 200 and 202 are described below. Assuming DWE circuits 200 and 202 are not available in some SRAM circuit, a "read-disturb-write" error can occur when both A_WL and B_WL are simultaneously active, which is the default operation for dual port SRAMs in some embodiments. Specifically, assume a write operation to the A-Port 18 of SRAM cell C1 and read or write (correct) operation at the same time to the B-port 20 of the SRAM cell C3. In this case, both A_WL and B_WL are active, which places the B-port 20 of the SRAM cell C1 in a "dummy read" condition, which can induce the A-port write failure.

Figure 2:
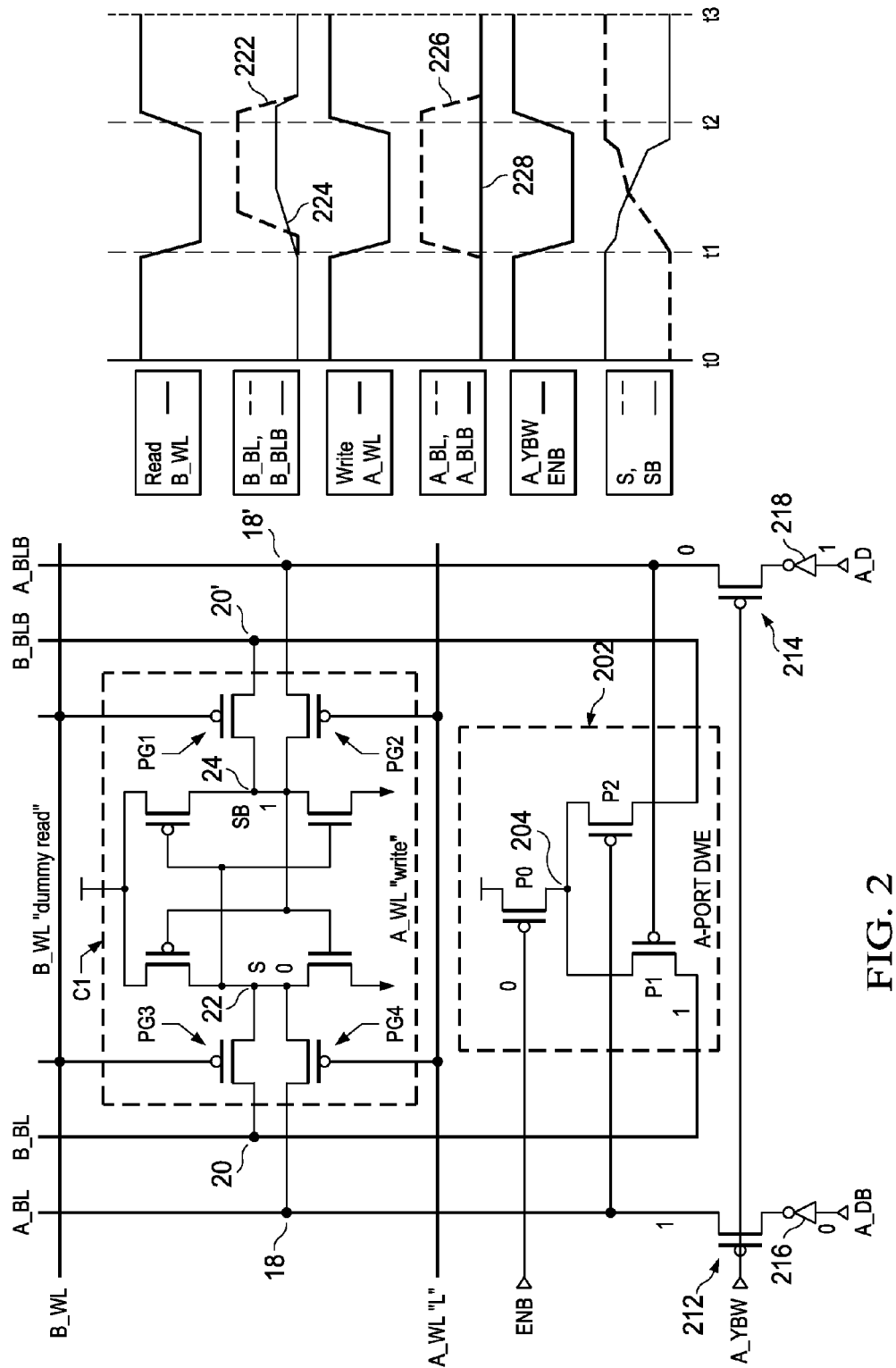
FIG. 2 illustrates in more detail an embodiment of the DWE circuit coupled to a SRAM cell and a timing diagram illustrating operation of the SRAM according to some embodiments.

FIG. 2 illustrates in more detail an embodiment of the DWE circuit 202 coupled to a SRAM cell C1 and a timing diagram illustrating operation of the SRAM according to some embodiments. The single SRAM cell C1 of FIG. 1 is connected to an embodiment of the A-port DWE 202. B-port DWE 200 is not shown for simplicity. As can be seen from FIG. 2, the SRAM cell C1 is configured as a pair of cross-coupled inverters that operate to reinforce the data state stored therein. For example, internal node 22 (labeled S) can be considered the "true" (i.e., true data value) node, and internal node 24 (labeled SB) can be considered the complementary node. The inverters hold the complementary node SB at the opposite binary data state of the data state held at the true node S.

The B_BLB line is connected to the complementary node SB through a first pass gate (access) transistor (PG1), which is controlled by B_WL. The A_BLB line is connected to the complementary node SB through a second pass gate transistor (PG2), which is controlled by A_WL. The B_BL line is connected to the true node S through a third pass gate transistor (PG3), which is controlled by B_WL. Finally, the A_BL line is connected to the true node S through a fourth pass gate transistor (PG4), which is controlled by A_WL.

ENB is the output of the A-port write assist enable circuit 112 connected to the A-port DWE 202. A_YBW is a write control signal of the A-port. ENB can be a level signal coming from the write assist enabled flag (from the A-port write assist enable circuit 112) or a pulse signal like A_YBW.

In the illustrated embodiment, the A-port DWE 202 includes three PMOS transistors P0, P1 and P2. Transistor P0 is a selection transistor controlled by ENB signal and is coupled between the high supply voltage node (Vdd) and internal node 204. The selection transistor P0 is a switch controlled by ENB, and this transistor is "on" (conducting) when ENB is enabled (logic 0). PMOS transistor P1 is coupled between node 204 and the B-port bit line node 20 (B_BL) and controlled at its gate by the A-port complementary bit line node 18' (A_BLB). Conversely, PMOS transistor P2 is coupled between node 204 and the B-port complementary bit line node 20' (B_BLB) and controlled at its gate by the A-port bit line node 18 (A_BL). Even though the B-port DWE 200 is not shown in FIG. 2 for simplicity, the circuit and connections are similar to the A-port DWE 202 with A-port connections and B-port connections exchanged.

The timing diagram included with FIG. 2 illustrates the operation of the DWE circuits of FIG. 2. A_BL, B_BL, A_BLB and B_BLB are all pre discharged (pulled down) to ground during time t0 to t1. Assume that two simultaneously received addresses in FIG. 1, address_A for a Port-A write operation and address_B for a Port-B read operation, are directed to the same row of the memory cells C1, C2, and C3. The row address contention detector 101 detects this condition and sends an output (a detection signal) to control the write assist enable circuits 112 and 110. Further assume at time t1 that the A-port is selected for a write operation on the memory cell C1 and the B-port is selected for a read operation on a different memory cell C3 in the same row. The A-port write assist enable circuit 112 of the memory cell C1 is enabled and the B-port write assist enable circuit 110 of the memory cell C1 is disabled.

The B-port of cell C1 is in "dummy read" operation since both PG1 and PG3 are in the "on" state during the interval. The signals A_YBW and EBN are enabled (low) at time t1. This condition enables the A-port DWE 202, i.e., P0 is on. Word line enable signals A_WL and B_WL are low from time t1 to time t2, which turns on all access transistors PG1 to PG4. A write operation on port A occurs from time t1 to time t2.

Since the write control signal A_YBW is low, PMOS transistors 212 and 214 are turned on. Assume a logic 1 (logic high) is to be written into the SRAM (i.e., to true data node S through node 18), then complementary write data signal A_DB is a logic 0 (logic low), which is inverted by inverter 216, and write data signal A_D is logic 1, which is inverted by inverter 218. During the A-port write operation, A_BL 216 is pulled up high and A_BLB 218 stays low. With A_BL high and A_BLB low, P2 is off and P1 is on, respectively. With P1 on, B_BL 212 is pulled up to VDD, while B_BLB 214 is not pulled up to VDD because P2 is off. This operation mitigates the dummy read disturbance and improves write margin of the SRAM.

If a "0" were being written to port A, then a "1" would be written to the complementary node. As such, P1 would be on and P2 would be off. This would pull up B_BLB 214 to Vdd and mitigate dummy read disturbance to write the 1 to the complementary node of Port-A. It should be understood that B-port DWE 200 in FIG. 1 operates in the same manner as A-port DWE 202 to mitigate dummy read disturbance when the write operation is performed on the B-port with the A-port word line in "dummy read".

Figure 3:
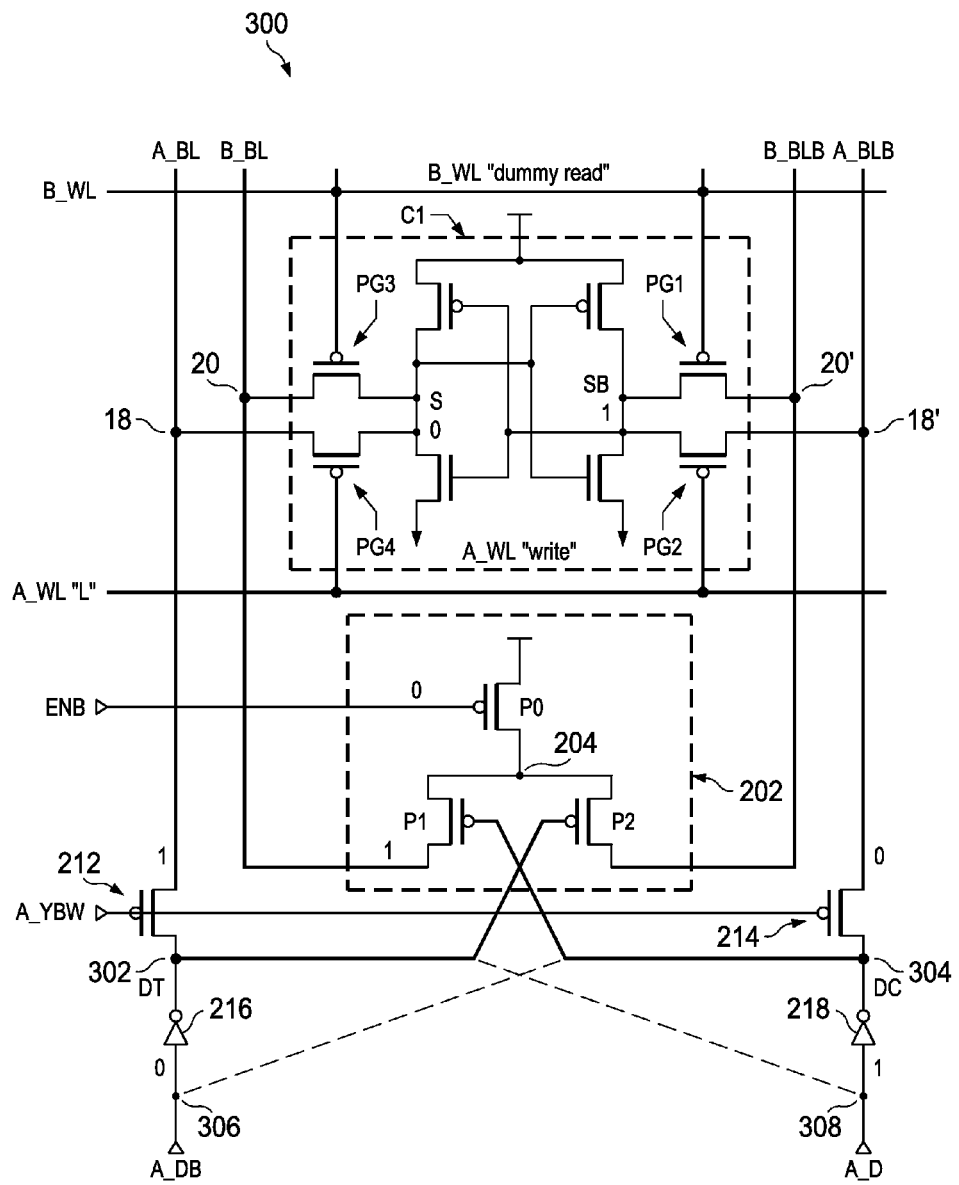
FIG. 3 illustrates a SRAM circuit having a DWE circuit for providing write assist according to some other embodiments.

FIG. 3 illustrates a SRAM circuit 300 having a DWE circuit 202 for providing write assist according to some other embodiments. The SRAM circuit 300 is similar to the SRAM circuit in FIG. 2, except the connection of PMOS transistors P1 and P2 in the A-port DWE circuit 202. The gates of the PMOS transistors P1 and P2 are connected to write data lines DC and DT at nodes 304 and 302 respectively in some embodiments. The write data lines DT and DC are coupled to the A_BL and A_BLB through the PMOS transistors 212 and 214, which are controlled by the write control signal A_YBW.

In some other embodiments, the gates of the PMOS transistors P1 and P2 are connected to write data lines A_DB and A_D at nodes 306 and 308 respectively before the inverters 216 and 218, as shown by dotted lines. Due to the inverters 216 and 218 that invert the logic values of the data lines DC and DT, the connections are reversed between DC and DT.

Figure 4:
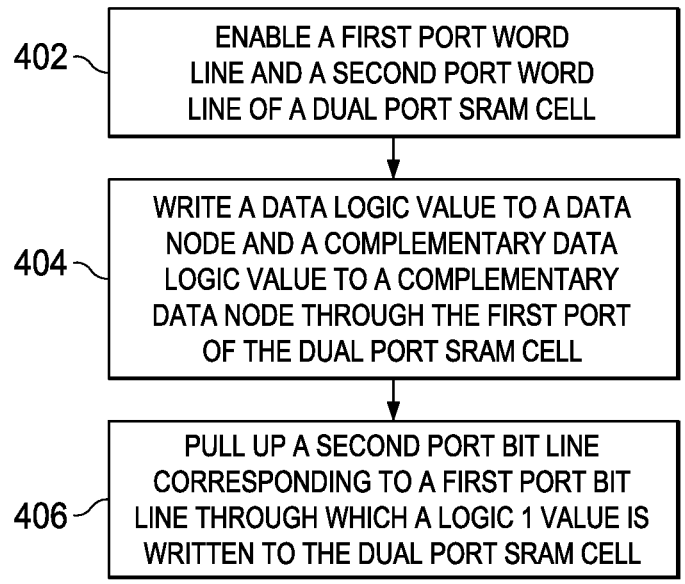
FIG. 4 is a flow diagram illustrating the operation of a SRAM cell with a DWE circuit.

FIG. 4 is a flow diagram illustrating the operation of a SRAM cell with a DWE circuit. At step 402, a first port word line (e.g., A_WL) and a second port word line (e.g., B_WL) of a dual port SRAM cell are enabled. At step 404, a data logic value (e.g., logic 0 or logic 1) is written to a data node (e.g., node S) and a complementary data logic value (e.g., logic 1 or logic 0 respectively) to a complementary data node (e.g., node SB) through the first port (e.g., port A) of the dual port SRAM cell. At step 406, a second port bit line (e.g., B_BL or B_BLB) corresponding to a first port bit line (e.g., A_BL or A_BLB respectively) through which a logic 1 value is written to the dual port SRAM cell is pulled up.

Figure 5:
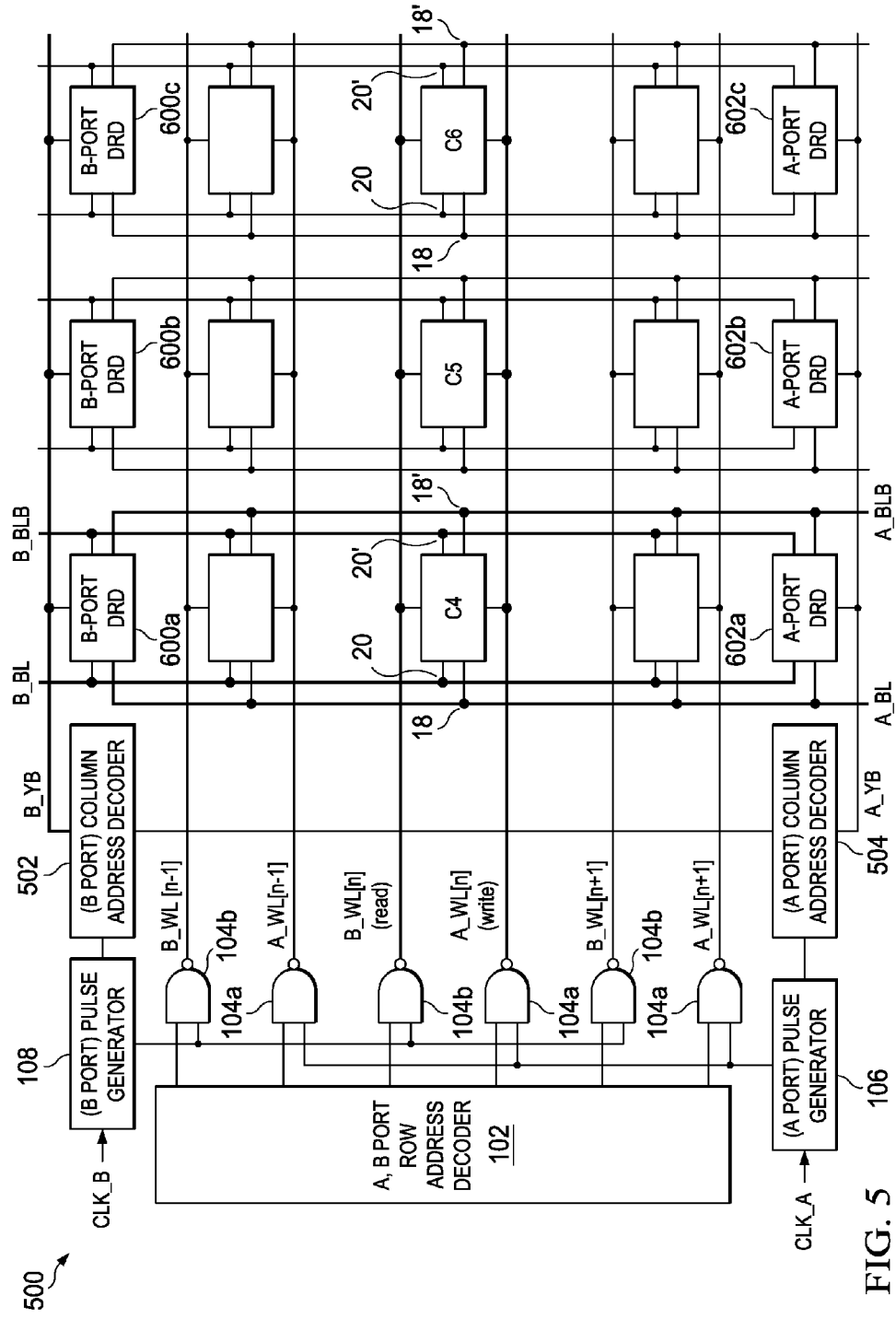
FIG. 5 illustrates a SRAM macro having A-port and B-port dummy read discharge (DRD) circuits for providing write assist according to some embodiments.

FIG. 5 illustrates a SRAM macro 500 ("SRAM") having A-port and B-port dummy read discharge (DRD) circuits 600 and 602 for providing write assist according to some embodiments. Respective B-port Dummy DRD circuits 600 and respective A-port DRD blocks 602 are associated with each column of SRAM cells. The SRAM 500 includes some illustrated components similar to the SRAM 100 in FIG. 1, which are described above and the description is not repeated here.

The B-port and A-port pulse generators 108 and 106 are coupled to the B-port and A-port column address decoders 502 and 504 respectively. The outputs of the B-port column address decoder 502 and A-port column address decoder 504 are provided to the B-port DRDs and A-port DRDs 600 and 602 respectively. The operation of the DRD circuit is described in detail with respect to FIG. 6.

Figure 6:
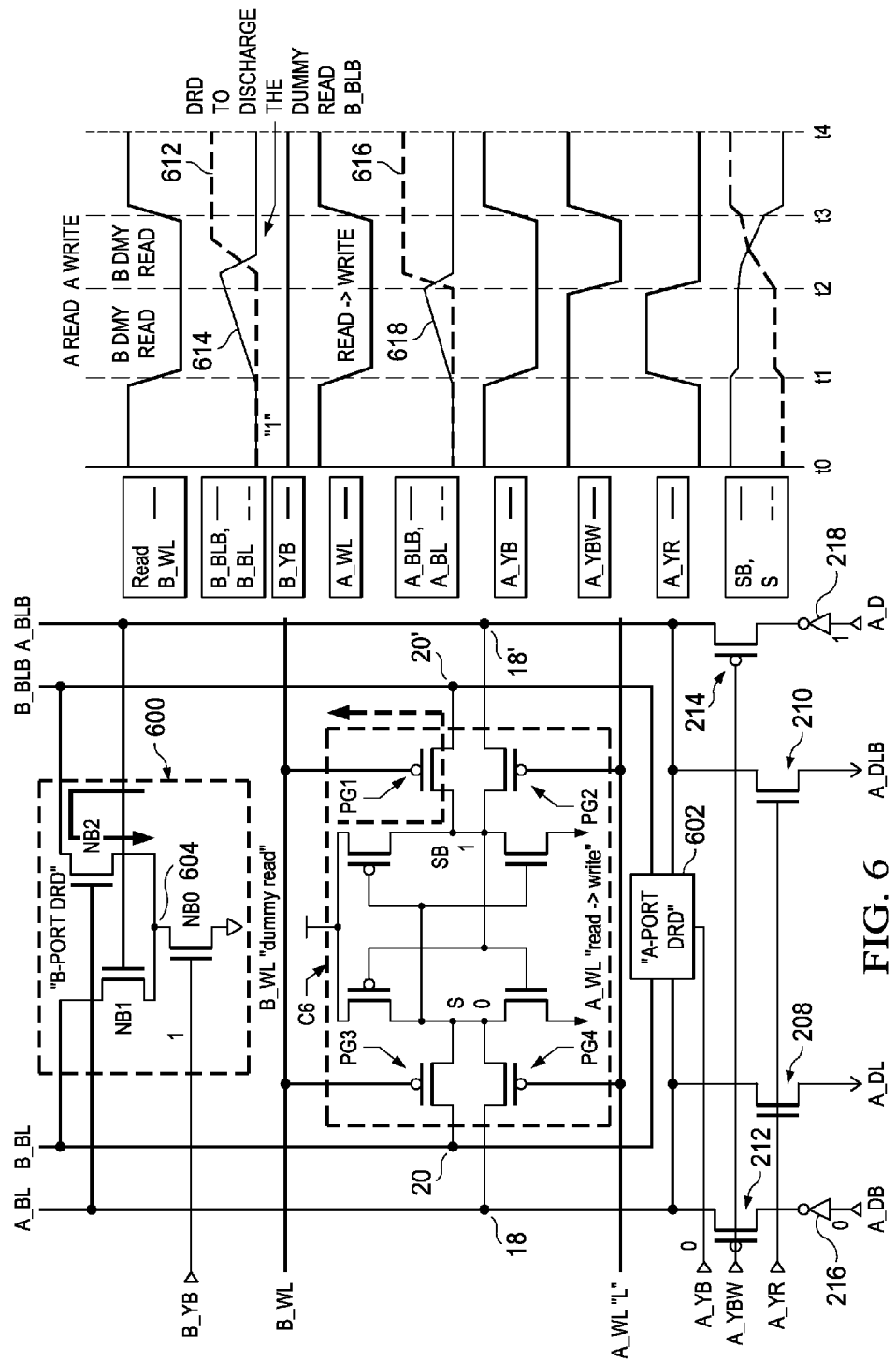
FIG. 6 illustrates in more detail an embodiment of the DRD circuit coupled to a SRAM cell and a timing diagram illustrating operation of the SRAM according to some embodiments.

FIG. 6 illustrates in more detail an embodiment of the DRD circuit 600 coupled to a SRAM cell C4 and a timing diagram illustrating operation of the SRAM according to some embodiments. The SRAM cell C4 is connected to an embodiment of the B-port DRD 600 and A-port DRD 602. The B-port DRD 600 is illustrated in detail and even though the A-port DRD 602 is not shown in detail in this example for simplicity, it should be understood that the A-port DRD 602 is implemented in a similar way as the B-port DRD 600 with A-port and B-port connections exchanged. Signal B_YB is the output of the B-port column address decoder 502 of FIG. 5, and signal A_YB is the output of the A-port column address decoder 504 of FIG. 5. The A_WL and B_WL signals are provided by the NAND gates 104a and 104b of FIG. 5. The A_WL and B_WL control access to the SRAM cell for a read or write operation. A-port and B-port bit lines and complementary bit lines (signals) are coupled to true data nodes 18 and 20, and complementary data nodes 18' and 20', respectively, through the access transistors PG1 to PG4.

In the illustrated embodiment, the B-port DRD 600 includes three NMOS transistors NB0, NB1 and NB2. Transistor NB0 is a selection transistor controlled by the B-port column selection signal B_YB and is coupled between the low voltage supply node (ground) and internal node 604. The selection transistor NB0 is a switch that is "on" (conducting) when B_YB is enabled (logic 1). B_YB is enabled (logic 1) when the column of the SRAM cell C4 is not selected for read/write through B-port. Thus, B-port of SRAM cell C4 is in a "dummy read" mode.

NMOS transistor NB1 is coupled between node 604 and the B-port bit line node 20 (B_BL) and controlled at its gate by the A-port complementary bit line node 18' (A_BLB). Conversely, NMOS transistor NB2 is coupled between node 604 and the B-port complementary bit line node 20' (B_BLB) and controlled at its gate by the A-port bit line node 18 (A_BL). The A-port DRD 602 is not shown in detail in this example for simplicity, but has a similar circuit as the B-port DRD 600 with the A-port and B-port connections exchanged.

The timing diagram included with FIG. 6 illustrates the operation of the DRD circuits of FIG. 6. Assume at time t1 that the signal A_YB is low and the B_YB signal is high (i.e., the A-port is selected for a read or write operation and the B-port is not selected). This condition enables the B-port DRD 600, i.e., NB0 is on, and disables the A-port DRD 602. Word line enable signals A_WL and B_WL are low from time t1 to time t3, which turns on all access transistors PG1 to PG4.

A read operation on port A occurs from time t1 to time t2. Read control signal A_YR goes high during this time period, which turns on NMOS transistors 208 and 210. True A-port data node S and complementary data node SB are read out as differential A-port data signals A_DL and A_DLB from nodes 18 and 18', respectively. Signals A_BL 616 and A_BLB 618 are initially discharged to ground, and from time t1 to t2 A_BL remains at ground while A_BLB is driven towards VDD by read current. It should be apparent that this represents a logic "0" stored at true data node S (with logic "1" at complementary data node SB'). B-port signals B_BL 612 and B_BLB 614 track the A-port signals during the read operation.

The A-port write operation follows during time t2 to t3. At the conclusion of the read operation (time t2) read control signal A_YR goes low to turn off NMOS transistors 208 and 210. Write control signal A_YBW goes low, turning on PMOS transistors 212 and 214. Assume a logic "1" is to be written into the SRAM (i.e., to true data node S through node 18), then complementary write data signal A_DB is a logic 0, which is inverted by inverter 216, and write data signal A_D is logic 1, which is inverted by inverter 218. During the A-port write operation, A_BL 616 is pulled high and A_BLB 618 is driven low. With A_BL high and A_BLB low, NB2 is on and NB1 is off, respectively. With NB2 on, B_BLB 614 is discharged (pulled down) to ground. This operation mitigates the dummy read disturbance by matching B_BLB 614 with A_BLB 618.

It should be understood that if a "0" were being written to through A-port, then a "1" would be written to the complementary node. As such, NB1 would be operational and NB2 would be off. This would discharge (pull down) B_BL to ground and mitigate dummy read disturbance to writing the 1 to the complementary node of A-port.

It should be understood that A-port DRD 602 operates in the same manner as B-port DRD 600 to mitigate dummy read disturbance when the write operation is performed on the B-port with the A-port word line in "dummy read".

Figure 7:
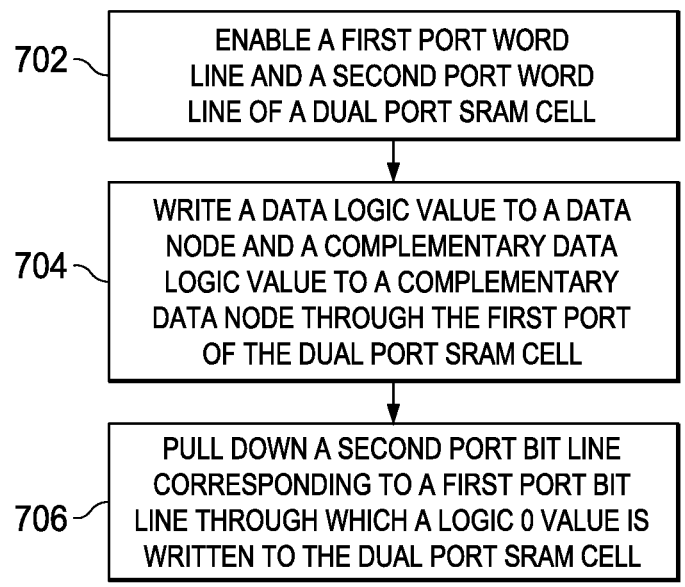
FIG. 7 is a flow diagram illustrating the operation of SRAM cell with a DRD circuit.

FIG. 7 is a flow diagram illustrating the operation of SRAM cell with a DRD circuit. At step 702, a first port word line (e.g., A_WL) and a second port word line (e.g., B_WL) of a dual port SRAM cell are enabled. At step 704, a data logic value (e.g., logic 0 or logic 1) is written to a data node (e.g., node S) and a complementary data logic value (e.g., logic 1 or logic 0 respectively) to a complementary data node (e.g., node SB) through the first port (e.g., port A) of the dual port SRAM cell. At step 706, a second port bit line (e.g., B_BL or B_BLB) corresponding to a first port bit line (e.g., A_BL or A_BLB respectively) through which a logic 0 value is written to the dual port SRAM cell is pulled down.

According to some embodiments, a static random access memory (SRAM) includes a first port word line, a second port word line, a first port bit line and a first port complementary bit line, a second port bit line and a second port complementary bit line, and a memory cell having a data node coupled to the first and second port bit lines and a complementary data node coupled to the first and second port complementary bit lines. The first and second port word lines control access to the memory cell. A circuit is configured to couple the second port bit line to a high voltage supply node during a write logic high operation to the data node through the first port bit line and couple the second port complementary bit line to the high voltage supply node during a write logic high operation to the complementary data node through the first port complementary bit line.

According to some embodiments, a static random access memory (SRAM), includes a first port word line, a second port word line, a first port bit line and a first port complementary bit line, a second port bit line and a second port complementary bit line, and a memory cell having a data node coupled to the first and second port bit lines and a complementary data node coupled to the first and second port complementary bit lines. The first and second port word lines control access to the memory cell. A circuit is configured to couple the first port bit line to a low voltage supply node during a write logic low operation to the data node through the second port bit line and couple the first port complementary bit line to the low voltage supply node during a write logic low operation to the complementary data node through the second port complementary bit line.

According to some embodiments, a static random access memory (SRAM), includes a first port word line, a second port word line, a first port bit line and a first port complementary bit line, a second port bit line and a second port complementary bit line, and a memory cell having a data node coupled to the first and second port bit lines and a complementary data node coupled to the first and second port complementary bit lines. The first and second port word lines control access to the memory cell. A circuit includes a first transistor and a second transistor. Sources of the two transistors are coupled together to a low voltage supply node or a high voltage supply node through a switch. A gate of the first transistor is coupled to the first port complementary bit line, a drain of the first transistor is coupled to the second port bit line, a gate of the second transistor is coupled to the first port bit line, and a drain of the second transistor is coupled to the second port complementary bit line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM), comprising:
   a first port word line;
   a second port word line;
   a first port bit line and a first port complementary bit line;
   a second port bit line and a second port complementary bit line;
   a memory cell having a data node coupled to the first and second port bit lines and a complementary data node coupled to the first and second port complementary bit lines, wherein the first and second port word lines control access to the memory cell; and
   a first circuit configured to couple the second port bit line to a high voltage supply node during a write logic high operation to the data node through the first port bit line and couple the second port complementary bit line to the high voltage supply node during a write logic high operation to the complementary data node through the first port complementary bit line.

2. The SRAM of claim 1, wherein the first circuit includes a selection transistor coupling a first circuit internal node to the high supply voltage node, a first transistor coupling the internal node to the second port bit line, and a second transistor coupling the internal node to the second port complementary bit line.

3. The SRAM of claim 1, further comprising a contention detector configured to receive a first port address and a second port address and to detect whether the first port address and the second port address are directed to the same row of the SRAM, wherein memory cells of the same row share the same word lines.

4. The SRAM of claim 1, wherein the first circuit is configured to be enabled during a first port write operation of the memory cell and disabled during a second port write operation of the memory cell.

5. The SRAM of claim 4, further comprising a control circuit configured to control the first circuit based on an output from the contention detector.

6. The SRAM of claim 1, wherein the first circuit comprises a first PMOS transistor and a second PMOS transistor, sources of the two PMOS transistors are coupled to the high voltage supply node through a switch.

7. The SRAM of claim 6, wherein a gate of the first PMOS transistor is coupled to the first port complementary bit line, a drain of the first PMOS transistor is coupled to the second port bit line.

8. The SRAM of claim 6, wherein a gate of the second PMOS transistor is coupled to the first port bit line, and a drain of the second PMOS transistor is coupled to the second port complementary bit line.

9. The SRAM of claim 1, further comprising a second circuit configured to couple the first port bit line to a high voltage supply node during a write logic high operation to the data node through the second port bit line and couple the first port complementary bit line to the high voltage supply node during a write logic high operation to the complementary data node through the second port complementary bit line.

10. A static random access memory (SRAM), comprising:
    a first port word line;
    a second port word line;
    a first port bit line and a first port complementary bit line;
    a second port bit line and a second port complementary bit line;
    a memory cell having a data node coupled to the first and second port bit lines and a complementary data node coupled to the first and second port complementary bit lines, wherein the first and second port word lines control access to the memory cell; and
    a first circuit configured to couple the first port bit line to a low voltage supply node during a write logic low operation to the data node through the second port bit line and couple the first port complementary bit line to the low voltage supply node during a write logic low operation to the complementary data node through the second port complementary bit line.

11. The SRAM of claim 10, wherein the first circuit includes a selection transistor coupling a first circuit internal node to the low supply voltage node, a first transistor coupling the internal node to the second port bit line, and a second transistor coupling the internal node to the second port complementary bit line.

12. The SRAM of claim 10, wherein the first circuit includes a selection transistor controlled by a column selection signal of the SRAM.

13. The SRAM of claim 10, wherein the first circuit is configured to be enabled when the memory cell is not selected for a first port operation.

14. The SRAM of claim 10, wherein the first circuit comprises a first NMOS transistor and a second NMOS transistor, sources of the two NMOS transistors are coupled to the low voltage supply node through a switch.

15. The SRAM of claim 14, wherein a gate of the first NMOS transistor is coupled to the first port complementary bit line, a drain of the first NMOS transistor is coupled to the second port bit line.

16. The SRAM of claim 14, wherein a gate of the second NMOS transistor is coupled to the first port bit line, and a drain of the second NMOS transistor is coupled to the second port complementary bit line.

17. The SRAM of claim 10, further comprising a second circuit configured to couple the second port bit line to a low voltage supply node during a write logic low operation to the data node through the first port bit line and couple the second port complementary bit line to the low voltage supply node during a write logic low operation to the complementary data node through the first port complementary bit line.

18. A static random access memory (SRAM), comprising:
- a first port word line;
- a second port word line;
- a first port bit line and a first port complementary bit line;
- a second port bit line and a second port complementary bit line;
- a memory cell having a data node coupled to the first and second port bit lines and a complementary data node coupled to the first and second port complementary bit lines, wherein the first and second port word lines control access to the memory cell; and
- a circuit comprising a first transistor and a second transistor, wherein sources of the first and the second transistors are coupled together to a low voltage supply node or a high voltage supply node through a switch, a gate of the first transistor is coupled to the first port complementary bit line, a drain of the first transistor is coupled to the second port bit line, a gate of the second transistor is coupled to the first port bit line, and a drain of the second transistor is coupled to the second port complementary bit line.

19. The SRAM of claim 18, wherein the circuit is configured to couple the second port bit line to a high voltage supply node during a write logic high operation to the data node through the first port bit line and couple the second port complementary bit line to the high voltage supply node during a write logic high operation to the complementary data node through the first port complementary bit line.

20. The SRAM of claim 18, wherein the circuit is configured to couple the first port bit line to a low voltage supply node during a write logic low operation to the data node through the second port bit line and couple the first port complementary bit line to the low voltage supply node during a write logic low operation to the complementary data node through the second port complementary bit line.

* * * * *